(12) United States Patent
Cheng et al.

(10) Patent No.: US 11,735,590 B2
(45) Date of Patent: Aug. 22, 2023

(54) FIN STACK INCLUDING TENSILE-STRAINED AND COMPRESSIVELY STRAINED FIN PORTIONS

(71) Applicant: International Business Machines Corporation, Armonk, NY (US)

(72) Inventors: Kangguo Cheng, Schenectady, NY (US); Julien Frougier, Albany, NY (US); Ruilong Xie, Niskayuna, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 151 days.

(21) Appl. No.: 17/098,300

(22) Filed: Nov. 13, 2020

(65) Prior Publication Data

US 2022/0157816 A1    May 19, 2022

(51) Int. Cl.
| | | |
|---|---|---|
| *H01L 27/092* | (2006.01) | |
| *H01L 29/16* | (2006.01) | |
| *H01L 29/66* | (2006.01) | |
| *H01L 21/8238* | (2006.01) | |
| *H01L 29/06* | (2006.01) | |
| *H01L 29/78* | (2006.01) | |

(52) U.S. Cl.
CPC .. *H01L 27/0924* (2013.01); *H01L 21/823821* (2013.01); *H01L 21/823878* (2013.01); *H01L 29/0649* (2013.01); *H01L 29/16* (2013.01); *H01L 29/66795* (2013.01); *H01L 29/785* (2013.01)

(58) Field of Classification Search
CPC ............. H01L 27/0924; H01L 27/0688; H01L 21/823821; H01L 21/823878; H01L 21/8221; H01L 21/823807; H01L 29/0649; H01L 29/16; H01L 29/66795; H01L 29/785; H01L 29/1054
USPC ......................................................... 257/369
See application file for complete search history.

(56) References Cited

U.S. PATENT DOCUMENTS

| | | |
|---|---|---|
| 8,628,989 B2 | 1/2014 | Lochtefeld |
| 9,093,533 B2 | 7/2015 | Cheng et al. |
| 9,236,463 B2 | 1/2016 | Adam et al. |
| 9,293,530 B1 | 3/2016 | Cheng |

(Continued)

FOREIGN PATENT DOCUMENTS

CN    103999202    8/2014

OTHER PUBLICATIONS

PRC National IP Administration as ISA, related PCT application PCT/IB2021/060301, ISR and Written Opinion, 11 pages total, dated Feb. 17, 2022.

*Primary Examiner* — Dao H Nguyen
(74) *Attorney, Agent, or Firm* — Samuel Waldbaum; Otterstedt & Kammer PLLC

(57) ABSTRACT

A fin stack including compressively strained and tensile-strained semiconductor fin regions allows CMOS fabrication to form vertically stacked p-type FinFETs and n-type FinFETs. Aspect ratio trapping within a semiconductor base region within the fin stack provides a relaxed semiconductor base region on which uniaxially strained regions are grown. A dielectric layer may be formed to electrically isolate the compressively strained semiconductor fin region from the tensile-strained semiconductor fin region.

13 Claims, 15 Drawing Sheets

(56) References Cited

U.S. PATENT DOCUMENTS

| | | |
|---|---|---|
| 9,318,491 B2 | 4/2016 | Cantoro et al. |
| 9,608,068 B2 | 3/2017 | Cheng et al. |
| 9,685,553 B2 | 6/2017 | Wang et al. |
| 9,761,661 B2 | 9/2017 | Ando et al. |
| 9,773,875 B1 | 9/2017 | Jagannathan |
| 9,905,650 B2 | 2/2018 | Cea et al. |
| 10,074,573 B2 | 9/2018 | Kim et al. |
| 10,665,512 B2 | 5/2020 | Zhou et al. |
| 10,727,298 B2 | 7/2020 | Peng et al. |
| 2007/0275522 A1 | 11/2007 | Yang |
| 2013/0154007 A1 | 6/2013 | Cheng |
| 2015/0037939 A1 | 2/2015 | Cheng et al. |
| 2016/0027777 A1 | 1/2016 | Eneman |
| 2016/0141370 A1 | 5/2016 | Cheng |
| 2018/0069118 A1 | 3/2018 | Cheng et al. |
| 2018/0076200 A1 | 3/2018 | Basker et al. |
| 2019/0229195 A1 | 7/2019 | Balakrishnan et al. |
| 2020/0006331 A1* | 1/2020 | Lilak ............... H01L 21/823431 |
| 2020/0098756 A1* | 3/2020 | Lilak ...................... B82Y 10/00 |
| 2020/0105751 A1* | 4/2020 | Dewey ................. H01L 27/092 |
| 2020/0118892 A1* | 4/2020 | Cheng ................. H01L 27/1211 |
| 2020/0176445 A1 | 6/2020 | Cheng |
| 2020/0294998 A1* | 9/2020 | Lilak ................... H01L 29/0649 |
| 2022/0037497 A1* | 2/2022 | Chung ............... H01L 21/8221 |

\* cited by examiner

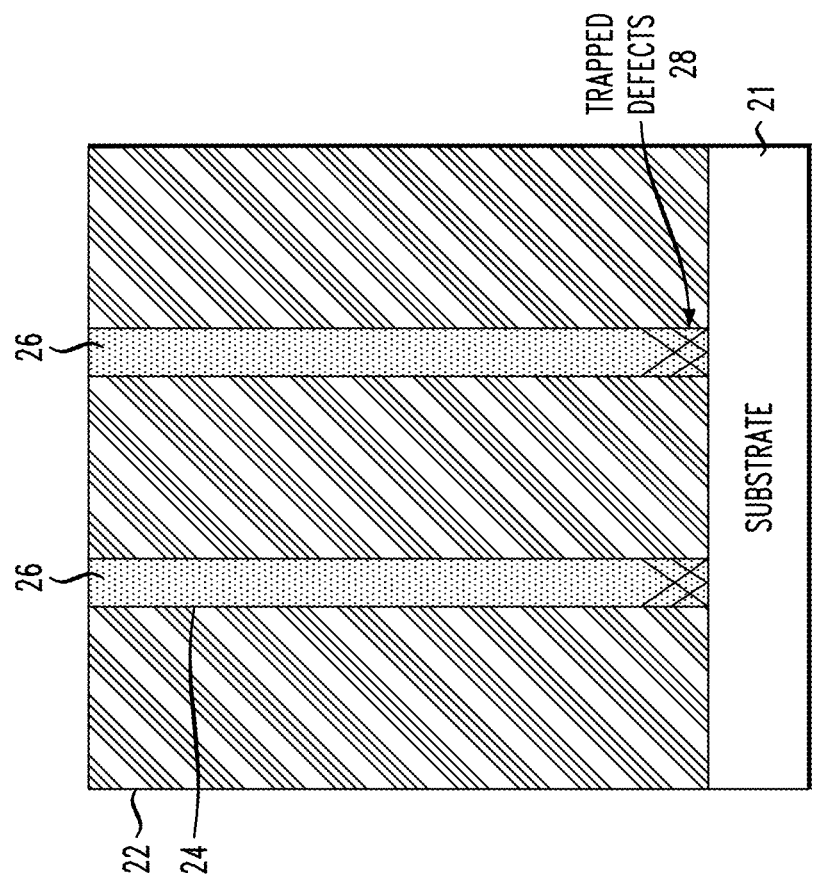
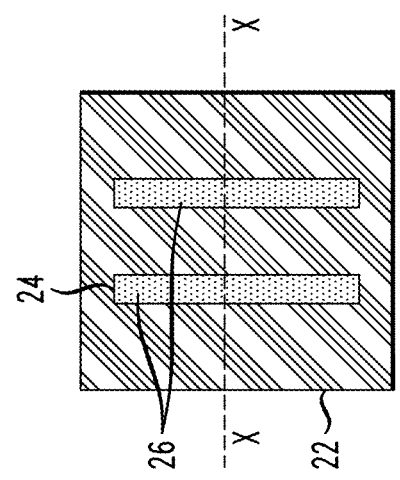

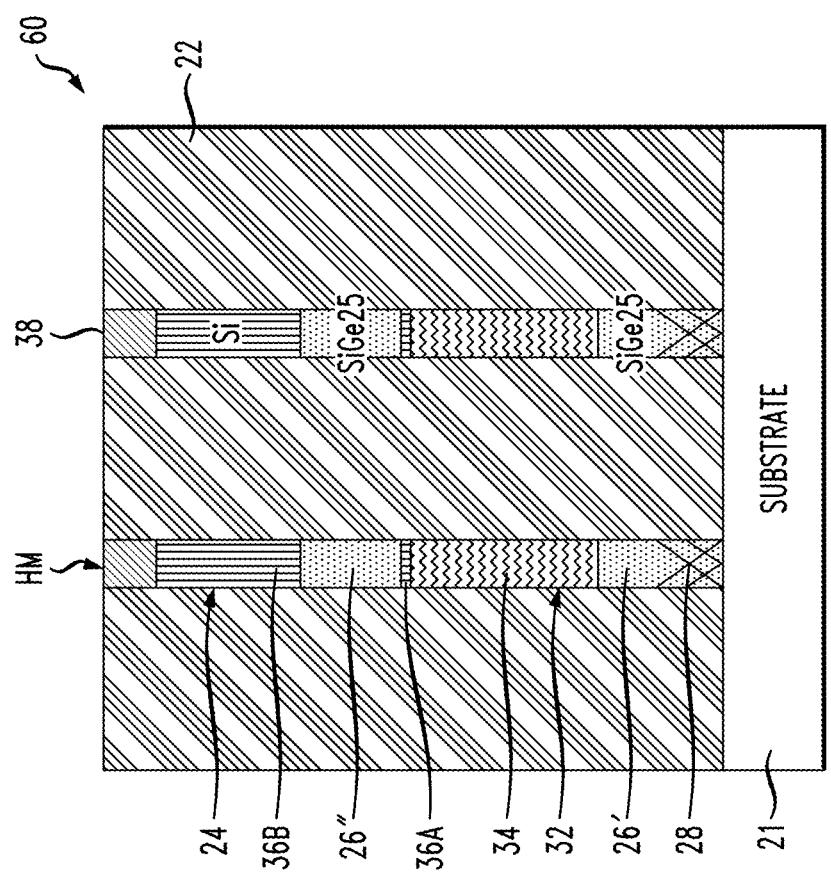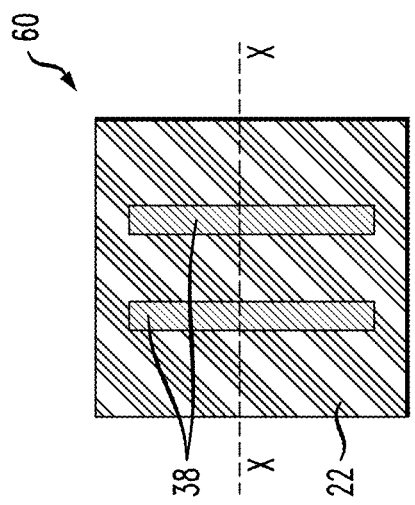

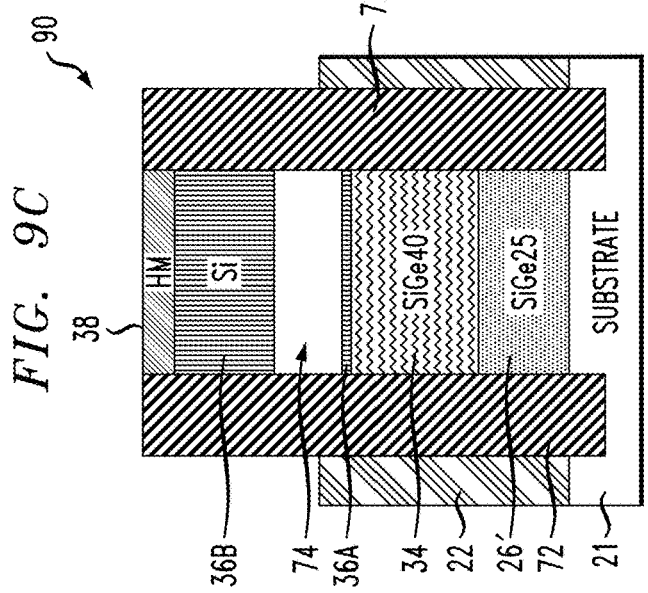
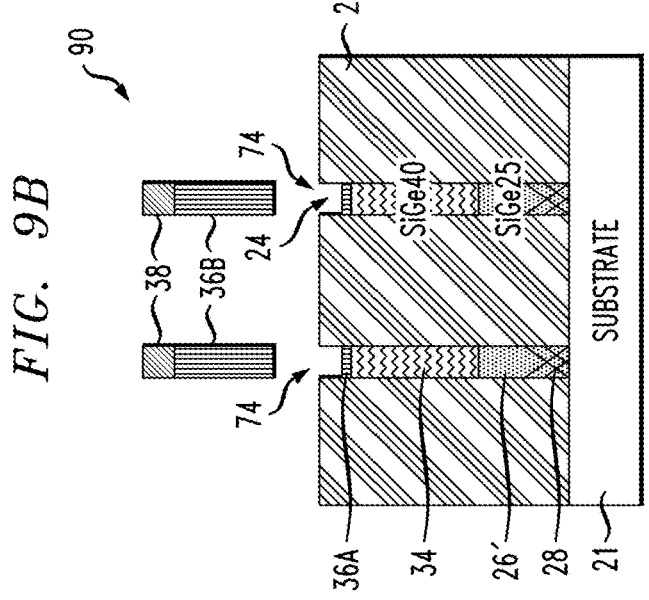
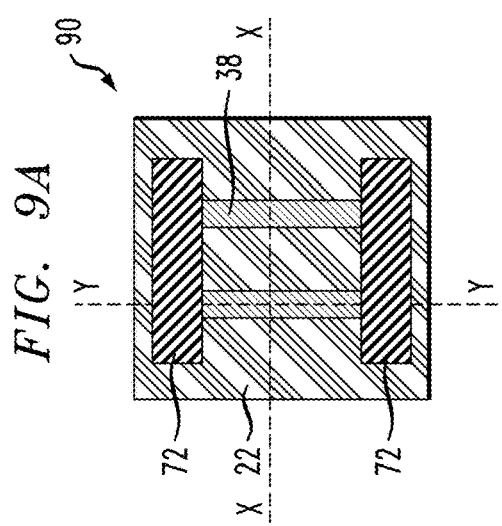

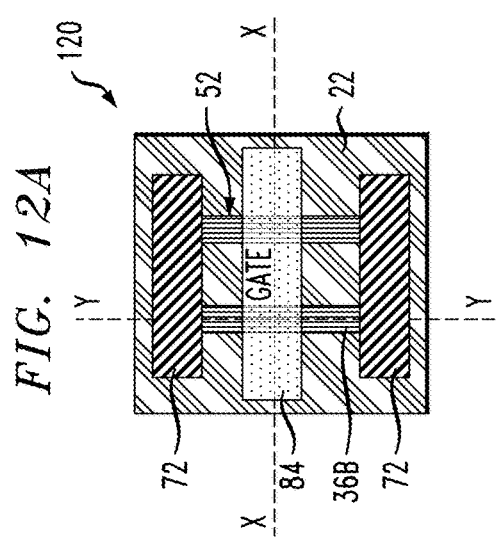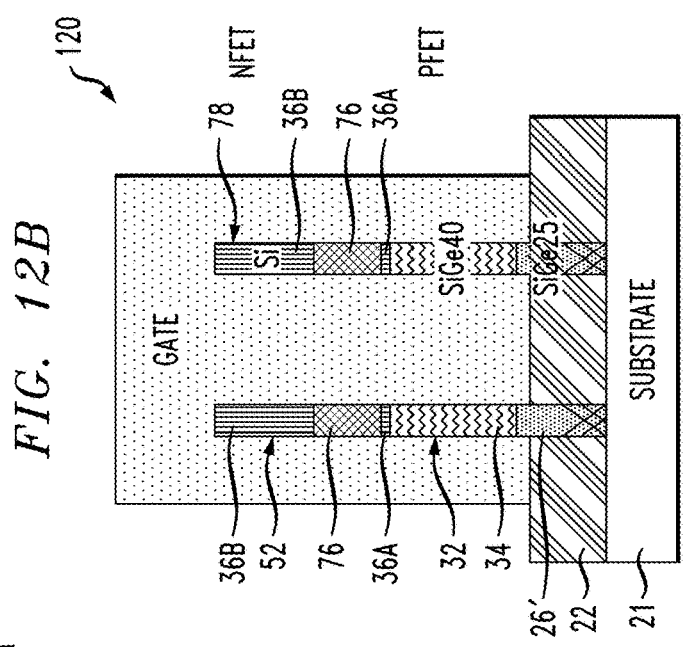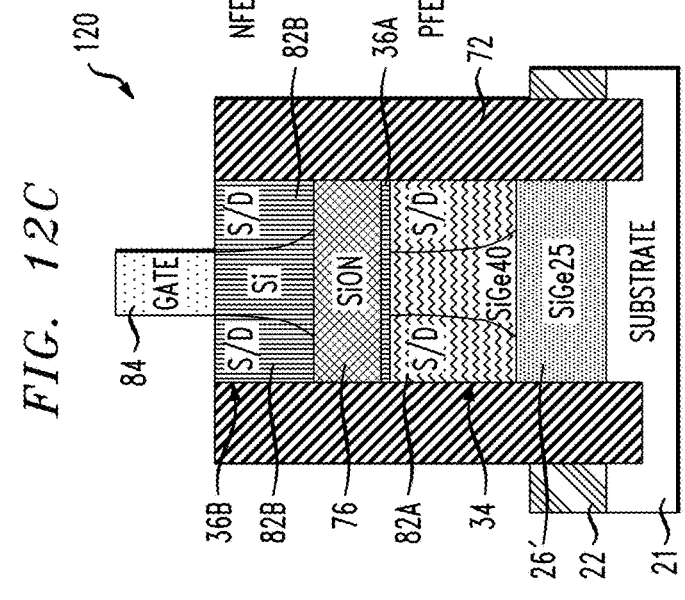

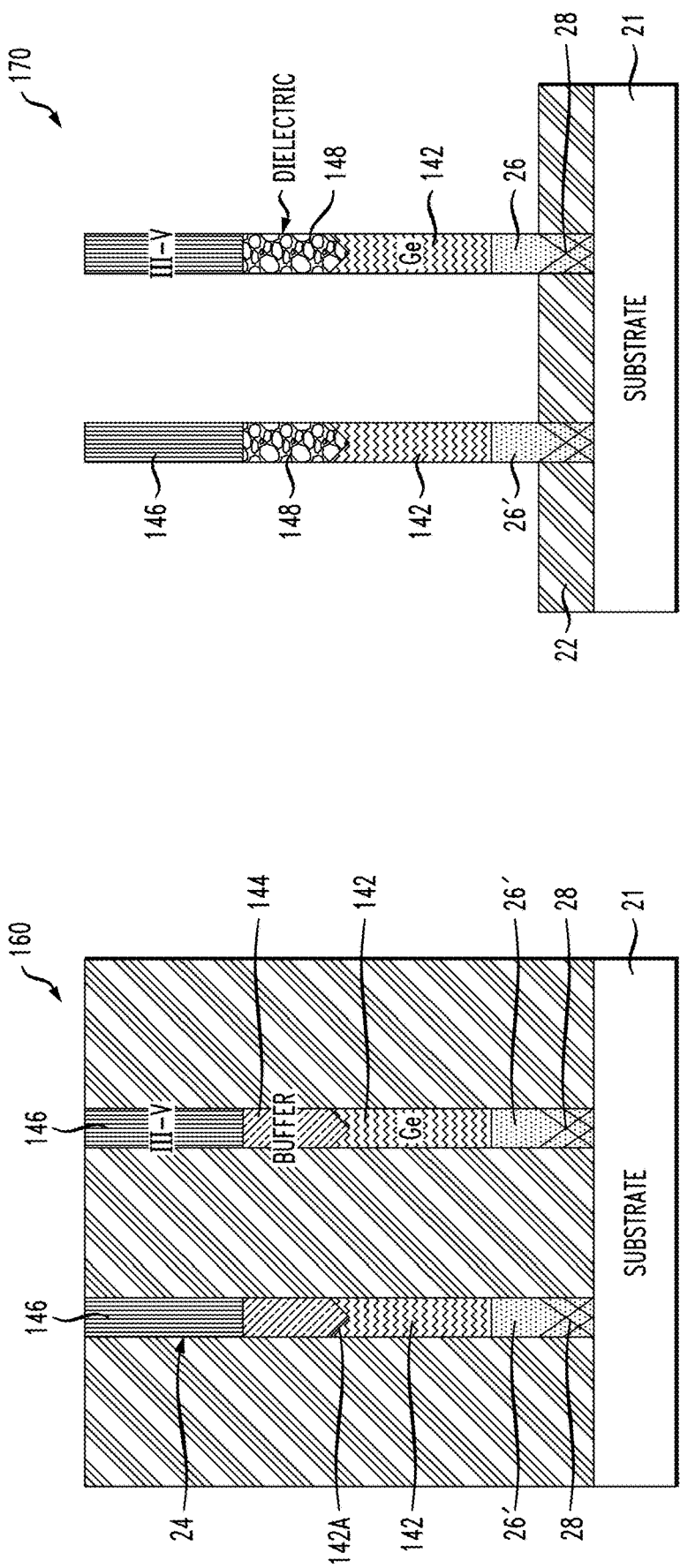

FIN STACK INCLUDING TENSILE-STRAINED AND COMPRESSIVELY STRAINED FIN PORTIONS

BACKGROUND

The present inventions relate generally to the electrical, electronic and computer arts and, more particularly, to finned semiconductor structures and devices and the fabrication of such structures and devices with different strains in different portions of a fin stack.

Fin-type field-effect transistors (FinFETs) have three-dimensional, non-planar configurations including fin-like structures extending above substrates. Some nFET devices require semiconductor layers under tensile strain to enhance electron mobility. Other devices or elements such as pFET devices require semiconductor layers under compressive strain to enhance hole mobility. The amount of strain on a silicon or silicon germanium layer grown epitaxially on a relaxed $Si_{1-x}Ge_x$ layer can be engineered by providing an atomic percentage of germanium within a selected range. A current technique involves the use of SiGe alloys having, for example, twenty-five percent (25%) germanium in a buffer layer ($Si_{0.75}Ge_{0.25}$) and an alloy containing a higher percentage of germanium (for example, $Si_{0.5}Ge_{0.5}$) in the adjoining pFET layer.

BRIEF SUMMARY

Techniques are provided for fabricating stacked, fin-type CMOS devices having different strain properties in electrically isolated portions of the same fins. Monolithic semiconductor structures including stacked, fin-type nFET and pFET devices are further provided that exhibit enhanced carrier mobility.

In one aspect, a method of fabricating a fabricating a finned, monolithic semiconductor structure includes forming at least one trench within a dielectric layer and extending down to a semiconductor substrate layer and epitaxially forming a bottom semiconductor base region within the at least one trench and adjoining the semiconductor substrate layer. Defects within the bottom semiconductor base region are trapped via aspect ratio trapping. A first semiconductor fin region is epitaxially formed within the at least one trench on the bottom semiconductor base region. The first semiconductor fin region has a first strain type. The method further includes epitaxially forming a second semiconductor fin region within the at least one trench over the first semiconductor fin region, the second semiconductor fin region having a second strain type. The first strain type is different from the second strain type.

In a further aspect, a finned, monolithic semiconductor structure includes a substrate layer and a fin structure extending vertically with respect to the substrate layer. The fin structure includes vertically stacked layers including a bottom semiconductor fin region having a first strain type and a top semiconductor fin region having a second strain type. The first strain type is different from the second strain type. A dielectric layer electrically isolates the bottom semiconductor fin region with respect to the top semiconductor fin region.

A semiconductor device according to a further aspect of the invention includes a semiconductor substrate layer and a multi-layer stack extending vertically with respect to the semiconductor substrate layer. The multi-layer stack includes an n-type FinFET including a tensile-strained channel region, a p-type FinFET including a compressive-strained channel region, and a dielectric layer vertically between and electrically isolating the n-type FinFET from the p-type FinFET.

Techniques as disclosed herein can provide substantial beneficial technical effects. By way of example only and without limitation, one or more embodiments may provide one or more of the following advantages:
  Increased transistor density;
  Enhanced carrier mobility;
  Different strains in different portions of electrically isolated fin portions.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 2A is a schematic, top plan view of the exemplary structure shown in FIG. 1A following epitaxial growth of semiconductor fin material on the semiconductor substrate and within the patterned dielectric layer;

FIG. 2B is a schematic, cross-sectional view thereof taken along line X-X of FIG. 2A;

FIG. 6A is a schematic, top plan view of the exemplary structure shown in FIG. 5A following formation of hardmasks within the patterned dielectric layer;

FIG. 6B is a schematic, cross-sectional view thereof taken along line X-X of FIG. 6A;

FIG. 9A is a schematic, top plan view of the exemplary structure shown in FIG. 8A following formation of cavities within the multi-layer fin structures;

FIG. 9B is a schematic, cross-sectional view thereof taken along line X-X of FIG. 9A;

FIG. 9C is a schematic, cross-sectional view thereof taken along line Y-Y of FIG. 9A;

FIG. 12A is a schematic, top plan view of the exemplary structure shown in FIG. 11A following CMOS fabrication to form a stacked structure including a tensile strained, fin-type nFET device over a compressively strained, fin-type pFET device;

FIG. 12B is a schematic, cross-sectional view thereof taken along line X-X of FIG. 12A;

FIG. 12C is a schematic, cross-sectional view thereof taken along line Y-Y of FIG. 12A;

FIG. 16 is a schematic, cross-sectional view of the structure shown in FIG. 15 following epitaxial growth of a buffer layer on the faceted top surfaces and a III-V semiconductor layer on the buffer layer; and FIG. 17 is a schematic, cross-sectional view of the structure shown in FIG. 16 following recessing of the dielectric layer and replacement of the buffer layer with dielectric material.

Figure 1B:
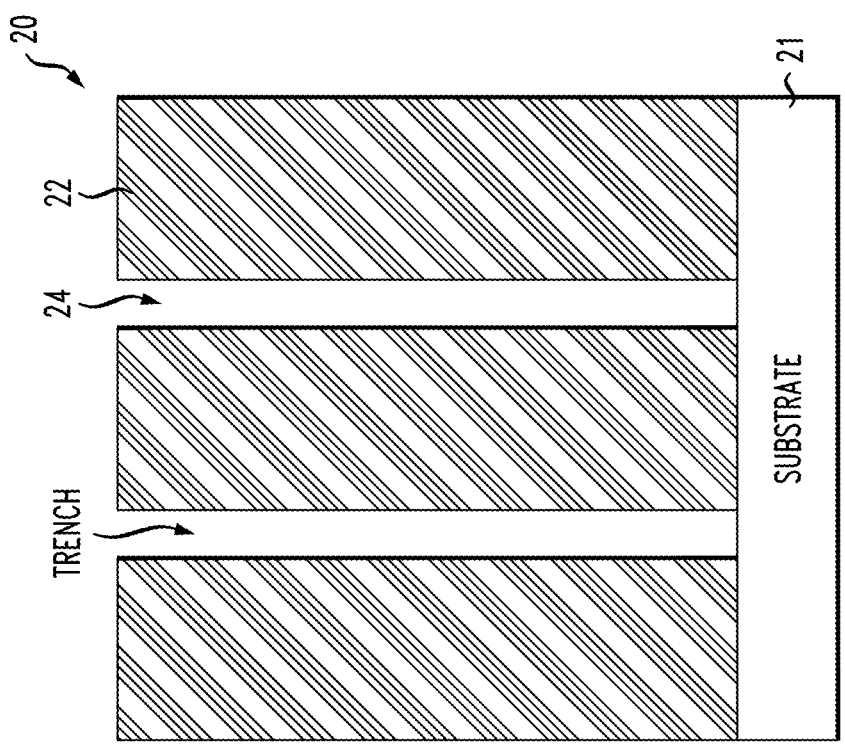
FIG. 1B is a schematic, cross-sectional view thereof taken along line X-X of FIG. 1A.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present inventions will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

A FinFET structure in accordance with one or more embodiments of the invention includes electrically isolated bottom and top semiconductor fin regions that are epitaxially grown on a semiconductor substrate within trenches above the semiconductor substrate. The crystalline orientation of the fins depends on the starting substrate orientation and the orientations of the trenches with respect to the underlying substrate. Miller indices are three-digit notations that indicate planes and direction within a crystal. In an exemplary embodiment, the semiconductor fin regions are grown on a crystalline silicon substrate having a $\{100\}$ crystallographic top surface. The fin sidewall surfaces of the semiconductor regions epitaxially grown on such a surface will comprise $\{100\}$ or $\{110\}$ crystallographic planes depending on the orientations of the trenches within which the fins are formed.

FinFET performance can be improved or degraded depending on stress tensor components and semiconductor crystal orientation in the fin. Semiconductor fins are typically etched on $\{100\}$ substrates and oriented along <110> crystallographic directions making the electrical current flow along $\{110\}$ planes in <110> direction. A single compressive stress tensor component along the electrical current flow, often referred to as the compressive uniaxial channel stress in the direction of current flow, improves performance of p-type FinFETs (pFinFETs) and slightly degrades performance of n-type FinFETs (nFinFETs). A single tensile stress tensor component along the electrical current flow, often referred to as the tensile uniaxial channel stress in the direction of current flow, improves performance of nFinFETs and degrades the performance of pFinFETs. In both the $\{100\}$ and $\{110\}$ planes, uniaxial tensile strain boosts electron mobility, which is beneficial in nFET devices. Compressive strain in such planes enhances hole mobility, which is beneficial in pFET devices. CMOS structures including stacked nFET and pFET devices exhibiting, respectively, enhanced electron and hole mobility, may be obtained in accordance with the teachings provided herein.

Figure 1A:
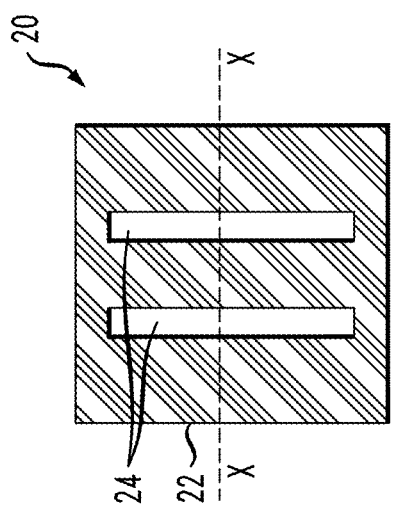
FIG. 1A is a schematic, top plan view of an exemplary structure including a patterned dielectric layer on a semiconductor substrate.

An exemplary process flow for fabricating stacked, fin-type devices including oppositely strained channel regions is shown in FIGS. 1A and 1B and subsequent figures. The thickness of fins obtained using the process can, for example, be from about three (3) nm to twenty (20) nm. The fin spatial period or the fin pitch can be between 25 nm and 60 nm. Lesser or greater fin pitch may, however, be desired for some applications. An exemplary process flow is outlined in FIG. 13.

Referring to FIGS. 1A and 1B, a monolithic structure 20 obtained during the process flow includes a substrate layer 21. A bulk semiconductor substrate or a crystalline semiconductor layer can, for example, be employed as the substrate layer. The substrate layer 21 is essentially undoped or lightly doped silicon having a $\{100\}$ crystallographic top surface in one or more embodiments. A dielectric layer 22 is deposited on the structure 20 with a thickness corresponding to the desired height of the multilayer fin structures that are later formed during the fabrication of stacked CMOS devices. The dielectric layer 22 may, for example, be an oxide such as silicon dioxide in one exemplary embodiment. Other dielectric materials may alternatively be employed in some embodiments, though etch selectivity between the dielectric layer and other elements to be incorporated during the CMOS fabrication process should be provided. The dielectric layer is deposited by any suitable deposition process including but not limited to CVD, PVD, plasma-enhanced CVD, atomic layer deposition (ALD), evaporation, chemical solution deposition, or like processes. The dielectric layer 22 may comprise multiple dielectric layers.

The dielectric layer 22 is patterned to form one or more high aspect ratio trenches 24 therein. Two trenches are illustrated in FIGS. 1A and 1B, though it will be appreciated that only one trench is formed in some embodiments and many trenches could be formed in other embodiments. As discussed above, the orientation of the trench(es) 22 determines whether semiconductor fin sidewall surfaces grown epitaxially within the trenches will comprise {100} or {110} crystallographic planes. The widths of the trenches correspond to the desired widths of the fins to be formed therein and are further configured to allow aspect ratio trapping (ART) by the semiconductor material(s) epitaxially grown on or over the substrate layer, as described below. Epitaxy is not limited by the width of the trench as it is done commonly by gas phase deposition. Forming a narrow trench as small as a few nanometers is also feasible in some embodiments. The trenches 24 extend down to the top surface of the substrate layer 21, which is a {100} surface in one or more exemplary embodiments.

In one or more embodiments, patterning of the dielectric layer 22 includes conventional deposition, photolithographic, and anisotropic etching steps. A hard mask layer (not shown) and a photoresist layer (not shown) are applied over the top surface of the dielectric layer 22 and lithographically patterned by exposure and development. The photoresist may be a block level photoresist that typically employs mid-ultraviolet (MUV) lithography for exposure and development. Alternately, the photoresist may be any other type of photoresist such as a deep-ultraviolet (DUV) photoresist, extreme-ultraviolet (EUV) photoresist, or electron beam resist. Employing the remaining portion of the photoresist layer or hard mask layer as an etch mask, the exposed portions of the dielectric layer 22 are removed by an etch. The etch may be a dry etch such as a reactive ion etch (ME). As an example, a fluorocarbon/fluorine-based etch is an exemplary etch that can be employed. As known in the art, oxide can be selectively etched using $CHF_3/Ar$ plasma. The photoresist is then stripped by ashing or other suitable process and the hard mask is removed. As schematically illustrated in FIG. 1B, the patterned dielectric layer includes parallel, high aspect ratio trenches 24 extending therein and having bottom ends adjoining the top surface of the substrate layer 21, which functions as an etch stop. A monolithic structure 20 as illustrated in FIGS. 1A and 1B can thereby be obtained.

Referring to FIGS. 2A and 2B, semiconductor fins such as silicon germanium (SiGe) fins 26 are epitaxially grown within the trenches 24 and directly on the top surface of the substrate layer 21. The terms "epitaxially growing and/or depositing" and "epitaxially grown and/or deposited" mean the growth of a semiconductor material on a deposition surface of a semiconductor material in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

The epitaxial deposition process may employ the deposition chamber of a chemical vapor deposition type apparatus, such as a low pressure chemical vapor deposition (LPCVD) apparatus. A number of different precursors may be used for the epitaxial deposition of semiconductor materials. In some embodiments, the gas source for the deposition of an epitaxially formed semiconductor material may include silicon (Si) deposited from silane, disilane, trisilane, tetrasilane, hexachlorodi silane, tetrachlorosilane, dichlorosilane, trichlorosilane, disilane and combinations thereof. In other examples, when the semiconductor material includes germanium, a germanium gas source may be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). III-V semiconductor compounds can be grown using MOCVD in embodiments where such compounds are employed.

Aspect ratio trapping (ART) is an effective technique to trap threading dislocations, thereby reducing the dislocation density of lattice mismatched materials such as silicon germanium grown on silicon. Defects 28 are trapped in the bottom portions of the SiGe fins 26, as schematically illustrated in FIG. 2B, due to the dimensions of the trenches 24 formed within the dielectric layer 22. The top portions of the SiGe fins 26 are essentially defect-free and fully relaxed. Silicon germanium overgrowth above the top surface of the dielectric layer 22 can be planarized using, for example, chemical mechanical planarization (CMP) techniques. In an exemplary embodiment, the silicon germanium fins 26 grown on the substrate layer contain about twenty-five percent germanium ($Si_{0.75}Ge_{0.25}$).

Figure 3B:
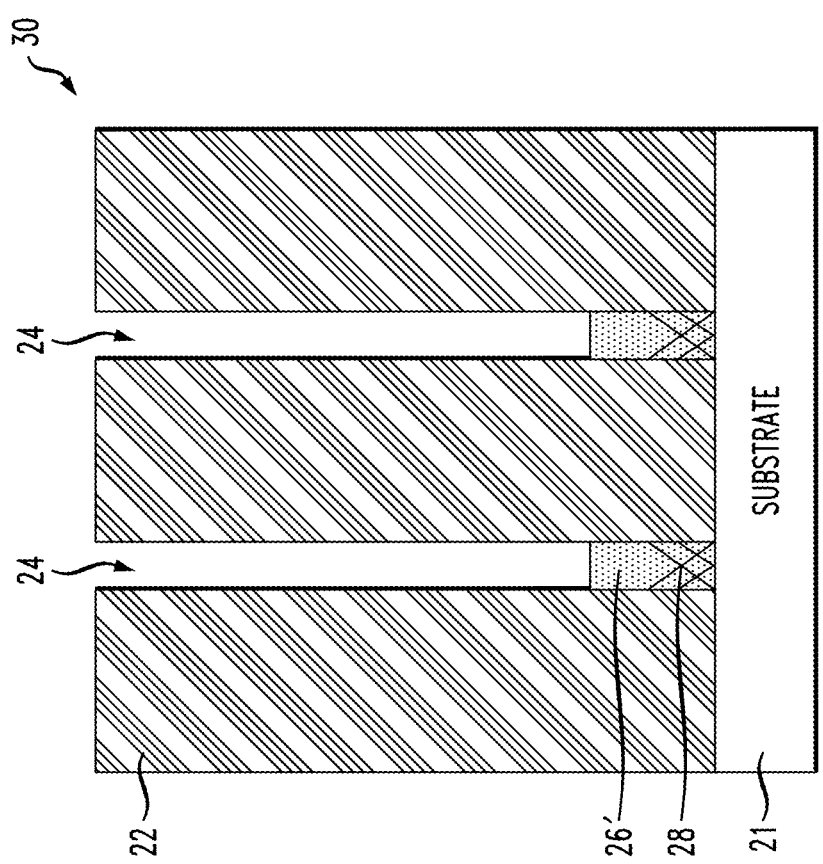
FIG. 3B is a schematic, cross-sectional view thereof taken along line X-X of FIG. 3A.
Figure 3A:
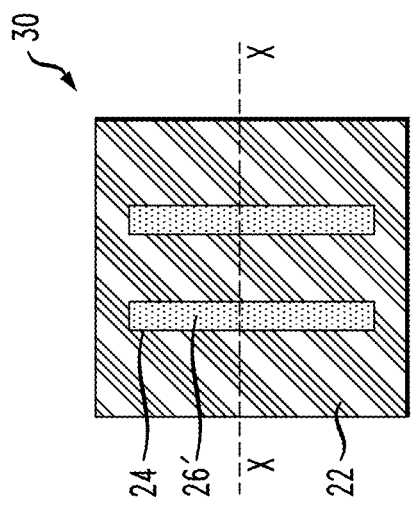
FIG. 3A is a schematic, top plan view of the exemplary structure shown in FIG. 2A following recessing of the semiconductor fin material.

As shown in FIG. 3B, the silicon germanium fins 26 are recessed to form fin base portions 26' and open spaces above the fin base portions within the vertical trenches 24. Substantially defect-free, relaxed regions of the silicon germanium fins 26 above the defects 28 remain in the fin base portions 26' following fin recessing. If the substrate layer 21 has a {100} top surface, the top surfaces of the bottom fin base portions 26' will also be {100}. The sidewalls of the fin base portions 26' (and the fins 26 from which they are formed) can be either {110} or {100} depending on the orientations of the trenches 24 with respect to the top surface of the substrate layer 21. A timed, selective etch can be employed for recessing of the silicon germanium fins 26. For example, a timed wet etch process containing ammonia and hydroperoxide can, for example, be used to etch SiGe selective to oxide and other materials. Alternatively, the SiGe fin can be recessed by a gas phase etch containing hydrogen fluoride (HCl), chlorine, or hydrogen bromide (HBr). FIGS. 3A and 3B schematically illustrate an exemplary monolithic structure 30 that may be obtained.

Figure 4B:
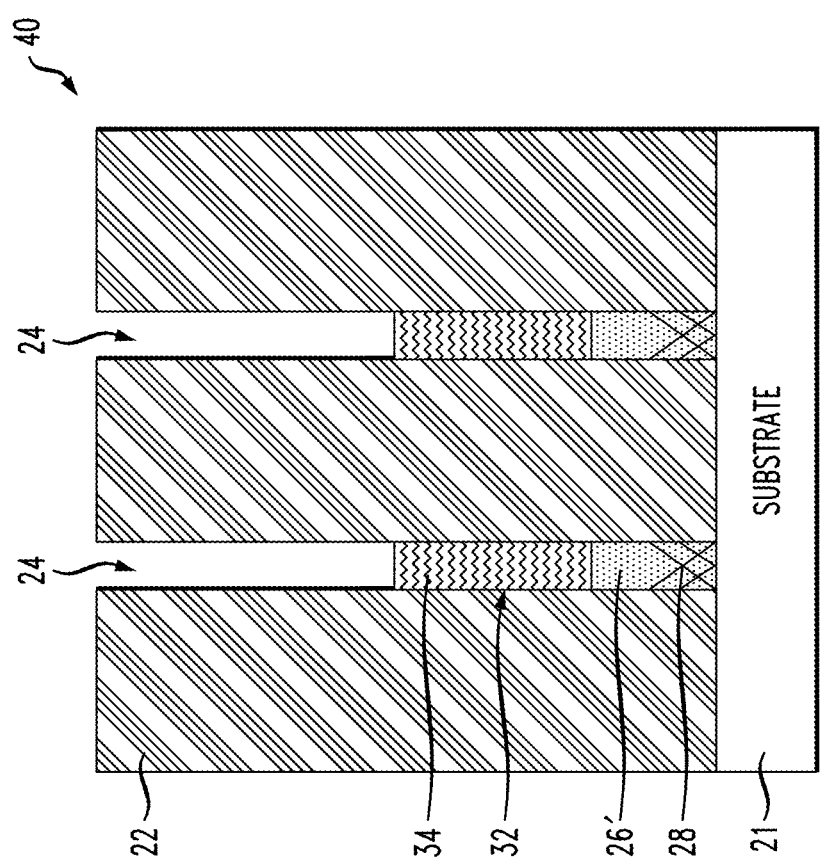
FIG. 4B is a schematic, cross-sectional view thereof taken along line X-X of FIG. 4A.
Figure 4A:
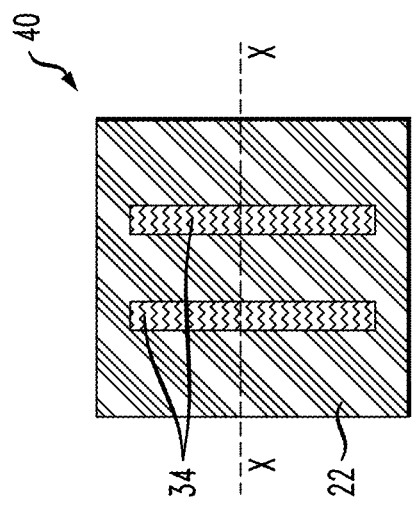
FIG. 4A is a schematic, top plan view of the exemplary structure shown in FIG. 3A following epitaxial growth of further semiconductor fin material within the patterned dielectric layer and recessing thereof.

With reference to FIGS. 4A and 4B, semiconductor fin (FinFET channel) material is epitaxially and selectively grown on the exposed top surfaces of the silicon germanium fin base portions 26'. In an exemplary embodiment, silicon germanium including a higher percentage of germanium relative to the underlying SiGe fin base portions 26' is grown (for example $Si_{1-x}Ge_x$ where x is 0.4, also referred to as SiGe40). While the absolute percentages of germanium in the fin channel regions and the underlying fin base portions 26' indicated herein are not considered critical, the fin channel material should contain a higher percentage of germanium than the fin base portions 26' so that the newly grown silicon germanium layer is compressively strained in embodiments wherein a bottom pFET is to be formed. During the layer-by-layer epitaxy growth, the crystalline lattice of the newly grown SiGe (e.g., SiGe40) matches the crystalline lattice of the underlying SiGe25. For fully relaxed SiGe40, its lattice constant is greater than SiGe25. When the lattice of the epitaxial SiGe40 matches the lattice of the underlying SiGe25, the SiGe40 is compressively strained along the fin direction (up-down direction in FIG. 2A and in-out direction in FIG. 2B). Strain may also develop along other directions but the strain magnitudes along other directions are much smaller than that along the fin direction. Thereinafter we refer the strain in the fin as uniaxial strain since it is the major stain component in the fin.

The SiGe40 layer deposited on SiGe25 will be substantially defect-free. According to thermodynamics, a system is more stable when it has lower total energy. Whether or not defects present in the epitaxy fin depends on the relative values of strain energy versus dislocation energy. Without defects, the epitaxy fin contains only strain energy. When defects are formed in a fin, the strain is relaxed, i.e., strain energy decreases. Meanwhile, dislocation-induced energy goes up. Strain energy and dislocation energy have different dependency on fin height. As long as the SiGe40 height is below a threshold value, the newly formed SiGe40 is free of misfit/dislocation as the strain energy is lower than dislocation-induced energy. As an example, a defect-free SiGe40 fin can be formed on SiGe25 with a vertical height of 200 nm.

Following deposition of the fin channel material, the structure is planarized and the fin channel material is recessed. Bottom fin regions 32 including the originally grown fin base portions 26' and compressively strained fin regions 34 are formed within the vertical trenches 24. The sidewalls of the bottom fin structures 32 can comprise either {110} or {100} surfaces. The resulting structure 40, as schematically illustrated in FIGS. 4A and 4B, includes a set of vertically extending, parallel semiconductor bottom fin structures 32 having substantially uniform height and thickness dimensions.

The compressively strained fin regions 34 may be lightly doped in situ, the choice of dopants depending on the type of FinFET (n-type or p-type) to be fabricated. By "in-situ" it is meant that the dopant that dictates the conductivity type of doped layer is introduced during the process step, for example epitaxial deposition, that forms the doped layer. Channel doping is typically opposite to the channel type; the n-channel of an nFET is lightly doped with p-type dopant whereas the p-channel type of a pFET is lightly doped with n-type dopant. Fin regions for nFETs may, for example, be doped with a p-type dopant such as boron to $1\text{-}50\times10^{16}$ $cm^{-3}$. Fin regions for pFETs may, for example, be doped with n-type dopants such as phosphorus or arsenic to $1\text{-}50\times10^{16}$ $cm^{-3}$. Alternatively, the compressively strained fin regions 34 are undoped.

Figure 5B:
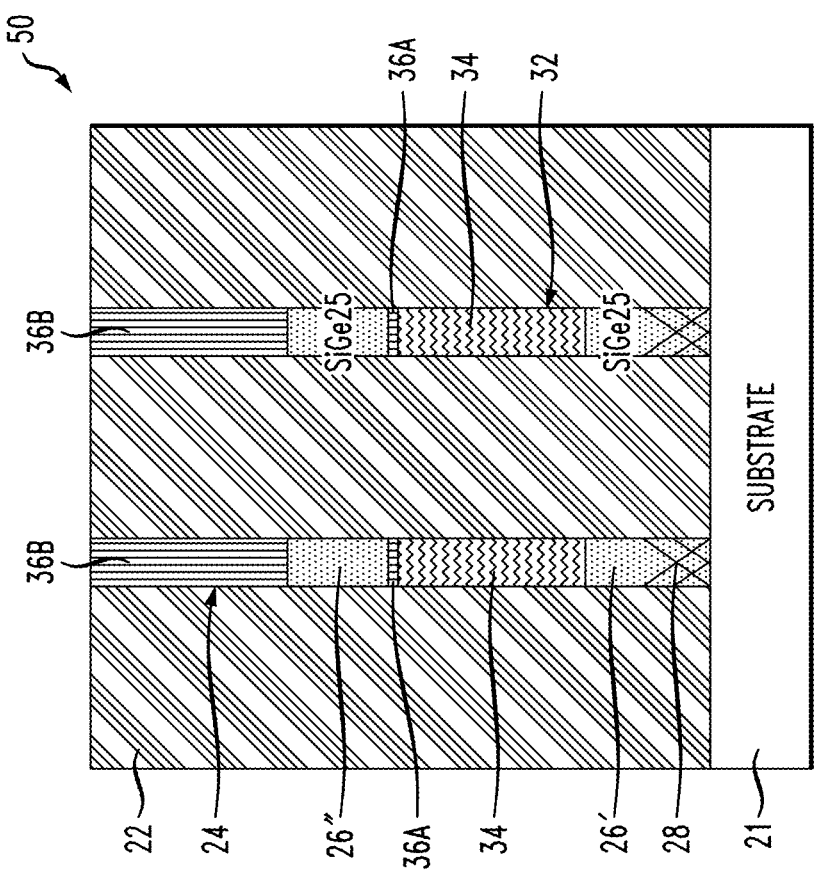
FIG. 5B is a schematic, cross-sectional view thereof taken along line X-X of FIG. 5A.
Figure 5A:
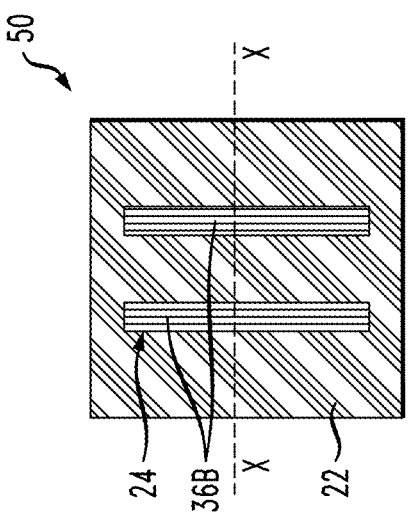
FIG. 5A is a schematic, top plan view of the exemplary structure shown in FIG. 4A following epitaxial growth of a thin semiconductor layer on the further semiconductor fin material and epitaxial growth of first and second semiconductor materials over the thin semiconductor layer.

A thin silicon layer 36A, an additional silicon germanium base layer 26", and silicon fins forming top silicon fin regions 36B are epitaxially grown sequentially above the bottom fin structures 32 in an exemplary embodiment to obtain a structure 50 as schematically illustrated in FIGS. 5A and 5B. Planarization and recessing steps, as discussed above with respect to formation of the bottom fin structures 32, may be employed as required in forming the new layers within the trenches 24. Excess silicon growth can be removed from the top surface of the dielectric layer 22 by CMP. The silicon germanium base layer 26" may contain about twenty-five percent germanium ($Si_{0.75}Ge_{0.25}$), though this percentage is not considered to be critical. The silicon germanium base layer 26" should be amenable to selective etching with respect to the semiconductor layers above and below it as well as with respect to the dielectric layer 22.

There will be no defects in the newly formed SiGe25 base layer 26" as it is, in effect, grown using SiGe25 as the template (base region 26') with strained SiGe40 (layer 34) and Si (layer 36A) in between. There is no lattice mismatch between newly formed SiGe25 and the underlying SiGe25, so no strain is formed. The purpose of the newly formed SiGe25 base region 26" is a placeholder for later formed dielectric isolation between the top fin segment and the bottom fin segment. In contrast, the epitaxial silicon layer 36B is tensily strained because for fully relaxed Si and SiGe25, Si has a smaller lattice constant than that of SiGe. When the lattice of the epitaxial Si matches the lattice of SiGe25 template, the silicon lattice has to stretch, resulting in tensile strain in silicon.

Referring to FIGS. 6A and 6B, the silicon fin regions 36B are recessed. A hardmask 38 is then formed over the top surfaces of the exposed silicon fin regions and fills the top portions of the trenches 24. The hardmask may be formed by depositing dielectric material such as silicon nitride on the underlying structure followed by CMP down to the top surface of the dielectric layer 22. Silicon nitride can be deposited via CVD, PECVD, sputtering, or other suitable technique A structure 60 as schematically illustrated in FIGS. 6A and 6B can be obtained.

Figure 7B:
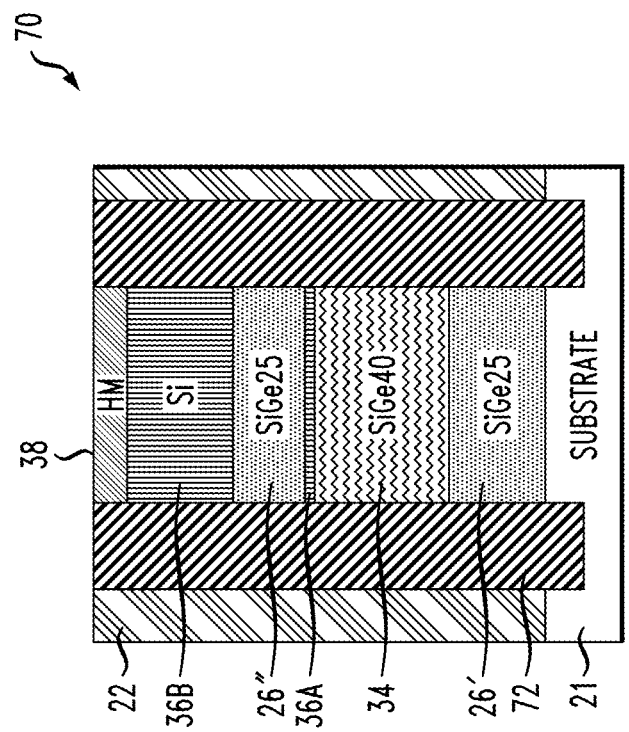
FIG. 7B is a schematic, cross-sectional view thereof taken along line Y-Y of FIG. 7A.
Figure 7A:
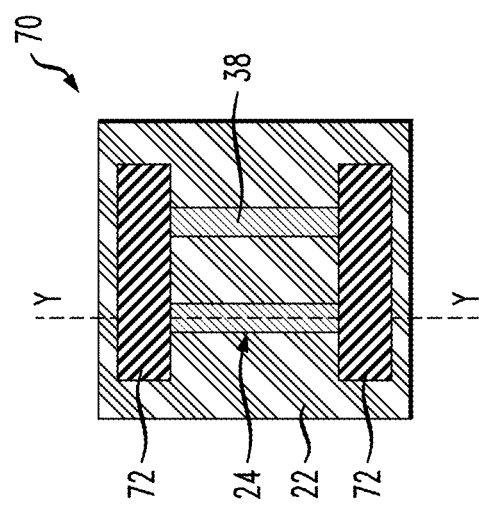
FIG. 7A is a schematic, top plan view of the exemplary structure shown in FIG. 6A following formation of dielectric anchor structures adjoining fin structure end portions.

Dielectric anchor structures 72 are formed at fin end portions to obtain an exemplary monolithic structure 70 as illustrated in FIGS. 7A and 7B. A fin cut mask (not shown) may be employed in forming an opposing set of recesses. The recesses extend vertically through the dielectric layer 22 and the semiconductor layers within the vertical trenches 24 that comprise parallel fins therein. The set of recesses formed in this step run perpendicularly with respect to the vertical trenches 24 and further extend into the substrate layer 21, as schematically illustrated in FIG. 7B. A sequence of reactive ion etch processes may be employed to selectively remove oxide material, hard mask material and semiconductor material. Anisotropic reactive ion etching is a directional etch employed in one or more exemplary embodiments for the removal of selected portions of the multi-layer semiconductor fin structures within the trenches 24 and the dielectric layer 22 in which the semiconductor fin structures are embedded. The set of opposing recesses, which intersect the vertical trenches 24 and comprise fin cut regions, is then filled with a dielectric material that forms the dielectric anchor structures 72 at opposing end portions of the parallel semiconductor fin structures as well as the hardmask 38. Chemical vapor deposition (CVD), including plasma-enhanced CVD, is a technique often used for the deposition of low-k dielectric materials such as siliconoxycarbonitride (SiOCN), which may be employed to form the anchor structures 72. Dielectric materials other than SiOCN may alternatively be employed to form the anchor structures. The ends of the parallel fin structures and hardmask, including the ends of each of the semiconductor layers that comprise the parallel, multi-layer fin structures at this stage of the fabrication process, adjoin and are supported by the dielectric anchor structures 72.

Figure 8A:
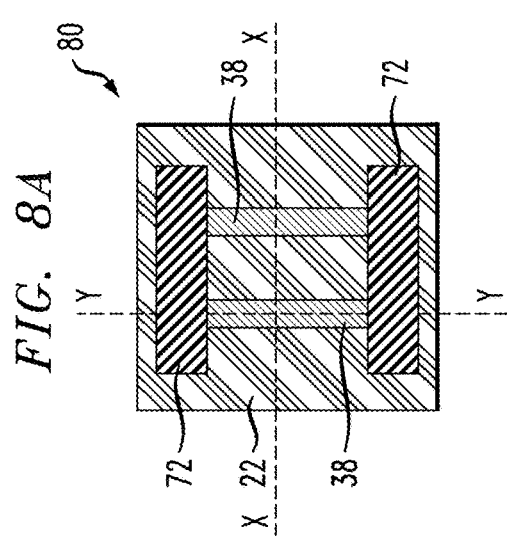
FIG. 8A is a schematic, top plan view of the exemplary structure shown in FIG. 7A following partial recessing of the dielectric layer.
Figure 8B:
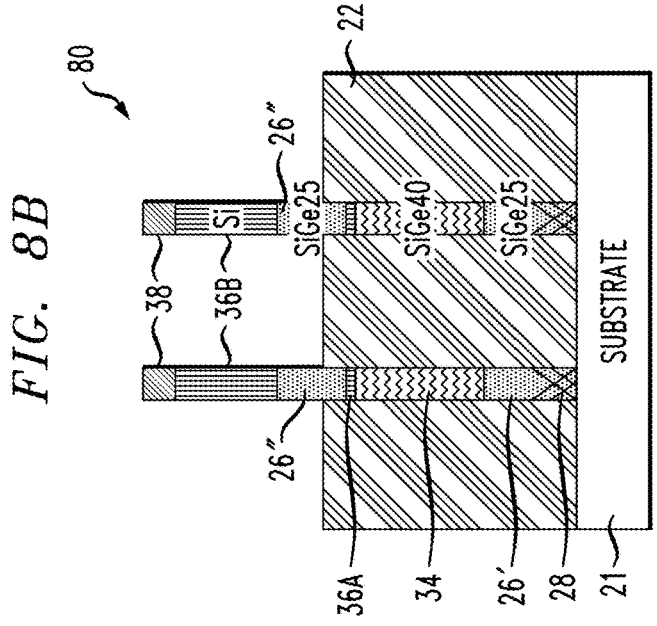
FIG. 8B is a schematic, cross-sectional view thereof taken along line X-X of FIG. 8A.
Figure 8C:
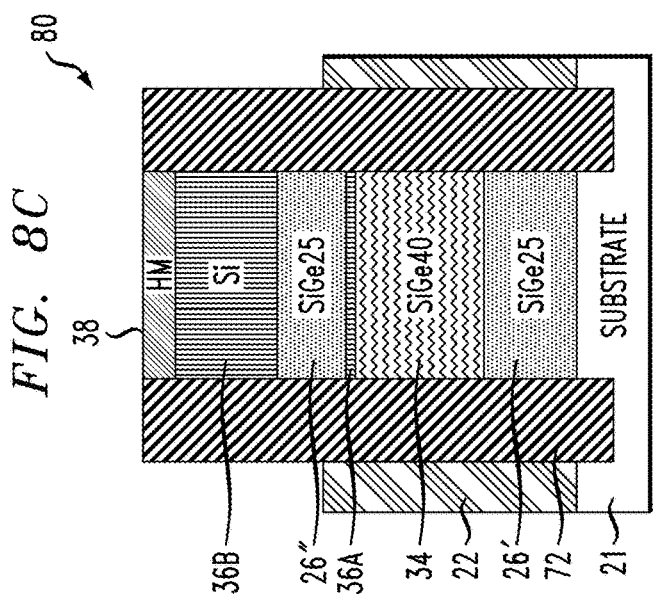
FIG. 8C is a schematic, cross-sectional view thereof taken along line Y-Y of FIG. 8A.

The dielectric layer 22 is recessed using a selective etch to obtain a monolithic structure 80 as schematically illustrated in FIGS. 8A, 8B and 8C. As best shown in FIG. 8B, the silicon germanium base layer 26" that adjoins the top fin region 36B is partially exposed following the recessing of the dielectric layer 22 while the thin silicon layer 36A adjoining the bottom of SiGe base layer 26" remains embedded.

The portions of the multi-layer semiconductor fin structures comprised by the silicon germanium base layer 26" are removed, thereby creating a cavity 74 within each of the semiconductor fin structures. A wet etch process containing ammonia and hydroperoxide can be used to etch SiGe selective to other materials, including silicon. Alternatively, the SiGe fin can be recessed by a gas phase etch containing hydrogen fluoride (HCl), chlorine, or hydrogen bromide. The dielectric anchor structures 72, being anchored at the ends of the layers comprising the fin structures, maintain the stability of the remaining portions of the semiconductor fin structures. The strains imparted in the embedded silicon germanium fin regions 34 and the exposed silicon fin regions 36B of the semiconductor fin structures are maintained. The thin silicon layer 36A functions as an etch stop and prevents the underlying silicon germanium fin region 34 from being etched. A structure 90 as shown in FIGS. 9A, 9B and 9C can accordingly be obtained.

Figure 10A:
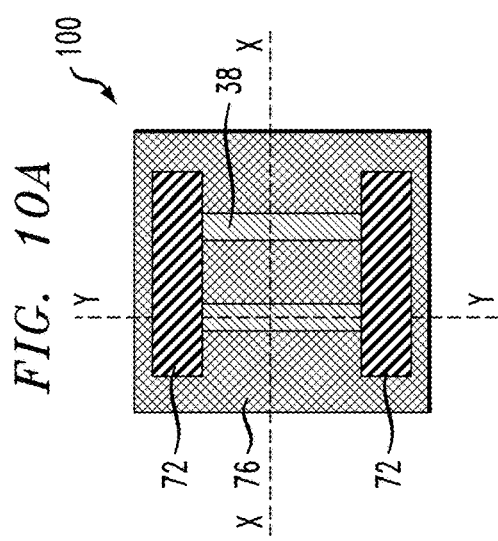
FIG. 10A is a schematic, top plan view of the exemplary structure shown in FIG. 10A following deposition of a dielectric fill thereon.
Figure 10C:
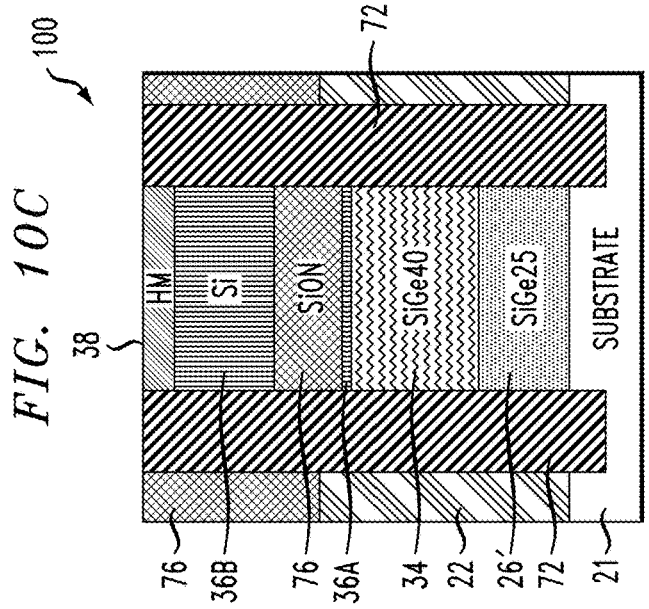
FIG. 10C is a schematic, cross-sectional view thereof taken along line Y-Y of FIG. 10A.
Figure 10B:
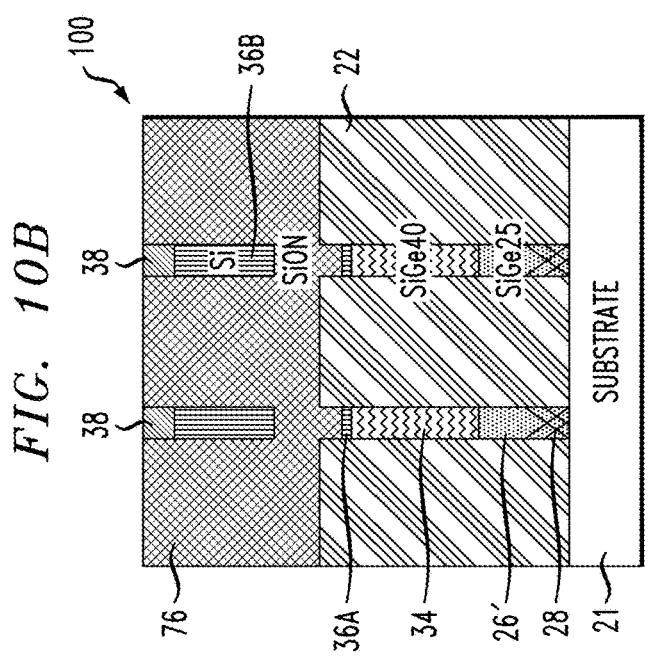
FIG. 10B is a schematic, cross-sectional view thereof taken along line X-X of FIG. 10A.

A dielectric fill layer 76 is deposited on the structure 90 and planarized. Silicon oxynitride (SiON), for example, may be deposited and the planarized down to the top surface of the hardmask 38 on the semiconductor fins. The dielectric fill layer 76 adjoins the top surface of the dielectric layer 22 and fills the cavities 74. It accordingly provides dielectric isolation of the compressively strained silicon germanium layer 34 and the tensile-strained silicon fin regions 36B. FIGS. 10A, 10B and 10C provide illustrative views of an exemplary structure 100 obtained following deposition and planarization of the dielectric fill layer 76.

Figure 11C:
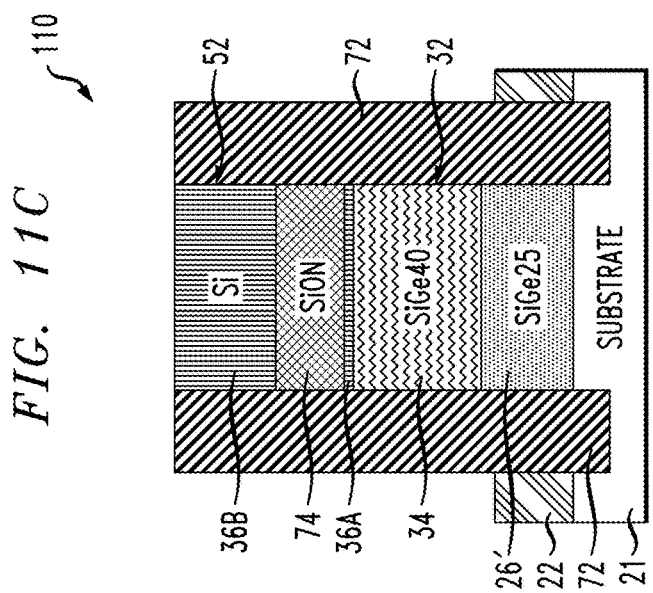
FIG. 11C is a schematic, cross-sectional view thereof taken along line Y-Y of FIG. 11A.
Figure 11B:
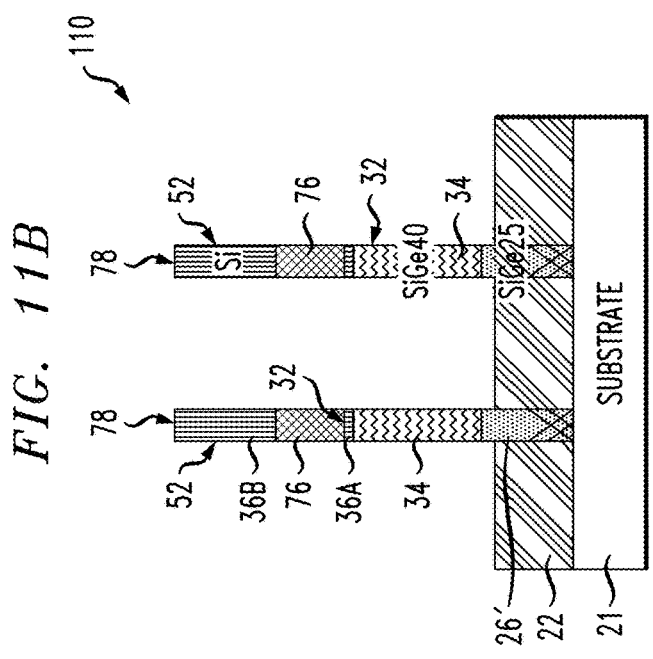
FIG. 11B is a schematic, cross-sectional view thereof taken along line X-X of FIG. 11A.
Figure 11A:
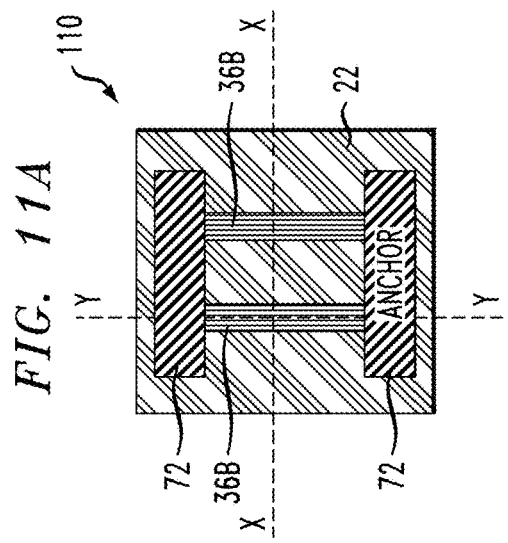
FIG. 11A is a schematic, top plan view of the exemplary structure shown in FIG. 10A following recessing of the dielectric fill and further recessing of the dielectric layer, thereby exposing stacked, multi-layer fin structures including oppositely strained top and bottom portions.

FIGS. 11A, 11B and 11C illustrate an exemplary structure 110 obtained following recessing of the dielectric fill layer 76, further recessing of the dielectric layer 22, and hardmask removal. The structure 110 includes parallel fin structures 78 extending vertically with respect to the substrate 21. Each fin structure includes a top portion or fin structure 52 and a bottom portion or fin structure 32. The top portion 52 of the stacked fin structure 78 includes a semiconductor region having a first uniaxial strain orientation. The bottom portion 32 of the fin structure 78 includes a semiconductor region having a second uniaxial strain orientation that is different from the first uniaxial strain orientation. In an exemplary embodiment, the top fin portions 52 of the fin structures 78 include tensile-strained fin regions 36B as discussed above while the bottom fin portions 32 thereof include compressively strained fin regions 34. The top and bottom fin portions 52, 32 are electrically isolated by dielectric regions 76 incorporated within the fin structures 78. It will be appreciated that, in an alternative embodiment, top fin portions can be grown to include compressively strained fin regions while the bottom fin portions can be grown to include tensile-strained fin regions.

The recessing of the dielectric fill layer 76 and the dielectric layer 22 and removal of the hardmask 38 can be performed using any suitable etching techniques depending on the materials employed therein. In embodiments including a $SiO_2$ dielectric layer 22, a SiON dielectric fill layer, and a SiN hardmask 38, a reactive ion etch may be employed to recess the dielectric fill layer and the underlying oxide layer selective to the fin hardmask 38. Any suitable etch process can then be used to remove the hardmask selective to Si, SiGe, SiON and $SiO_2$. The exemplary structure 100 may be placed into a process chamber (not shown) configured for a plasma etch, i.e., a reactive ion etch. An anisotropic etch employing plasma is performed on the exemplary structure. The plasma may contain one or more of, for example, $CF_4$, $CHF_3$, and $SF_6$. The composition of the gas supplied into the process chamber can further include $O_2$. Pressure is maintained between 0.2-0.5 Torr in an exemplary embodiment. The silicon nitride hard mask 38 can then be selectively removed using hot $H_3PO_4$ wet chemistry or other suitable process. Alternatively, a reactive ion etch can be used to recess the dielectric fill layer and the dielectric layer as well as to remove the hardmask selective to silicon and silicon germanium. A plasma etch containing $CHF_3/O_2$ can, for example, be employed to recess $SiO_2$, SiON and to remove SiN selective to the semiconductor layers within the fin structures 78. The SiOCN anchor structures 72 remain following exposure of the fin structures 78.

The revealed fin structures 78 include two "active" fin portions (34 and 36B) that serve as the basis for forming dielectrically isolated, stacked transistors. Source/drain regions 82A,82B can be formed on the semiconductor fin structures 78 after the formation of disposable gate structures and gate spacers (not shown) have been completed. A p-channel device (pFET) and an n-channel device (nFET) can be fabricated using the fin structures 78 by matching the source/drain dopant or conductivity type to the transistor channel type in inversion, as known in the art. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contributes free electrons to an intrinsic semiconductor. Examples of n-type dopants, i.e., impurities in a silicon-containing substrate include but are not limited to antimony, arsenic and phosphorous.

Source/drain regions are formed after the disposable gate structures and gate spacers (not shown) have been completed. For example, selected n-type dopants can be introduced into portions of the nFET region that are not covered by disposable gate structures and gate spacers to form the source/drain regions. Similarly, other selected p-type dopants can be introduced into portions of the pFET region that are not covered by disposable gate structures. The methods of selectively introducing dopants into source/drain regions may include selective epitaxial growth with in-situ doping, partial fin recess, and/or ion implantation. The entire substrate is then subjected to a rapid thermal anneal, laser anneal, and/or flash anneal, to induce a precise diffusion of source/drain dopants underneath the gate spacer forming an overlap between the source/drain regions and the disposable gate structures. The depth to which source/drain regions are doped is roughly equal or deeper than the active fin height to provide an unimpeded current flow to and from the transistor channel.

Expanded source/drain regions may be grown epitaxially on the exposed sidewall portions of the active semiconductor regions 34, 36B. Doped silicon or silicon germanium grown epitaxially on the sidewalls (for example, {110} surfaces) of the fin structures 78 increases the volumes of the source/drain regions, provides doping, and acts as stressors in some embodiments. Uniaxial strain that may be caused by epitaxially grown source/drain regions may be described as "extrinsic". In contrast, the strain in the semiconductor regions forming the channel regions of the fin structures 78 is intrinsic.

The disposable gate structures are removed by at least one etch employing an etch chemistry that is selective to the gate spacers and to the dielectric materials of a planarization dielectric layer (not shown). Replacement gate structures 84 are ordinarily formed in gate cavities by replacement of the disposable structures and overlie channel regions (comprised of portions of the silicon germanium fin region 34 and the silicon fin region 36B) of the field-effect transistors. Methods of fabricating FinFET devices using semiconductor fins are known to the art and continue to be developed. A network of metallic interconnects (not shown) is employed to wire electrical contacts to FinFETs to form useful circuits.

FIGS. 12A, 12B and 12C provide views of an exemplary stacked structure 120 following CMOS fabrication as described above. The stacked structure 120 includes an nFET and a pFET that are vertically stacked and electrically isolated with respect to each other by the dielectric fill layer 76. The pFET includes a compressively strained channel region comprising a portion of the silicon germanium fin region 34 of the fin structure 78. A gate structure 84 including gate dielectric and gate electrode layers adjoins the channel regions of the pFET and nFET. Doped source/drain regions 82A adjoin the channel region on opposite sides of the gate 84. In some embodiments, the source/drain regions 82A include epitaxial structures having p-type conductivity grown on {100} or {110} sidewalls of the silicon germanium fin regions 34. The nFET within the structure 120 is above the pFET and includes a channel region formed from a portion of the silicon fin region 36B. The silicon fin regions 36B, including the channel portions therein, have bottom surfaces that adjoin the dielectric fill layer 76. The gate structure 84 adjoins the channel region of the nFET. Typically, nFET and pFET may have different gate stacks, both of which may represented schematically by element 84 in FIG. 12B. This can be done by patterning in conjunction with depositions. The source/drain regions 82B of the nFET have n-type conductivity and may comprise epitaxial structures grown on the sidewalls of the uniaxial tensile-strained fin regions 36B. The ends of the fin structures 78 adjoin the anchor structures 72. The fin structures 78 extend vertically from the {100} surface of a silicon substrate layer 21 in an exemplary embodiment.

Gate dielectric can comprise any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD). In some embodiments, the gate dielectric has a thickness ranging from 1 nm to 5 nm, although less thickness and greater thickness are also contemplated.

Gate conductor can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, carbon nanotube, conductive carbon, graphene, or any suitable combination of these materials. The conductive material may further comprise dopants that are incorporated during or after deposition. In some embodiments, the gate may further comprise a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition.

The structure may further comprise contacts (not shown) to source/drain and gate, and interconnection between devices.

Figure 13:
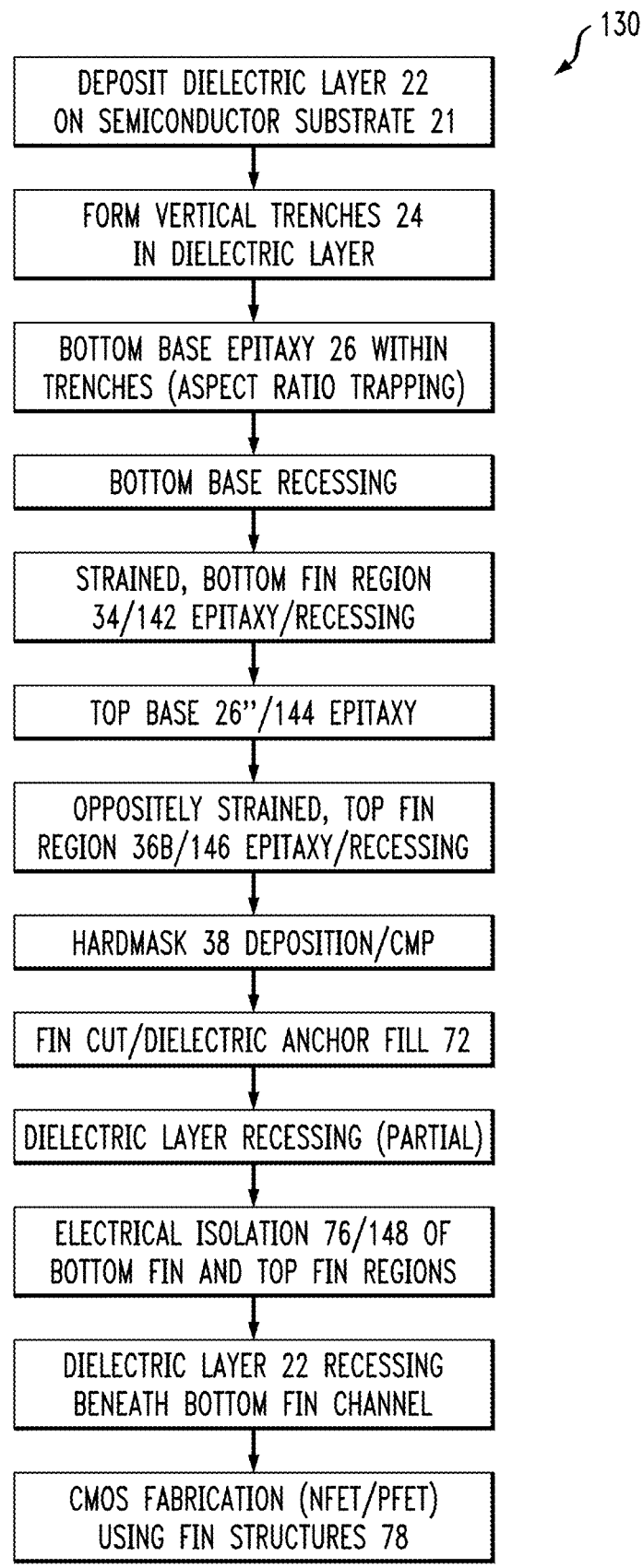
FIG. 13 is a flow chart illustrating an exemplary process flow for fabricating stacked, fin-type CMOS devices.

FIG. 13 illustrates an exemplary sequence of steps 130 that may be employed in fabricating structures as shown and described herein. The reference numbers employed in FIG. 13 correspond to those used in describing the exemplary embodiments discussed herein and which are schematically illustrated in other figures.

A further embodiment of the invention provides a stacked fin structure including germanium channel regions for use within pFETs and a compound semiconductor (e.g., III-V compound semiconductor) for channel regions to be employed within nFETs. A III-V compound semiconductor is an alloy containing elements from groups III and V in the periodic table. Such stacked fin structures can be fabricated using, in part, techniques similar to those described above.

Figure 14:
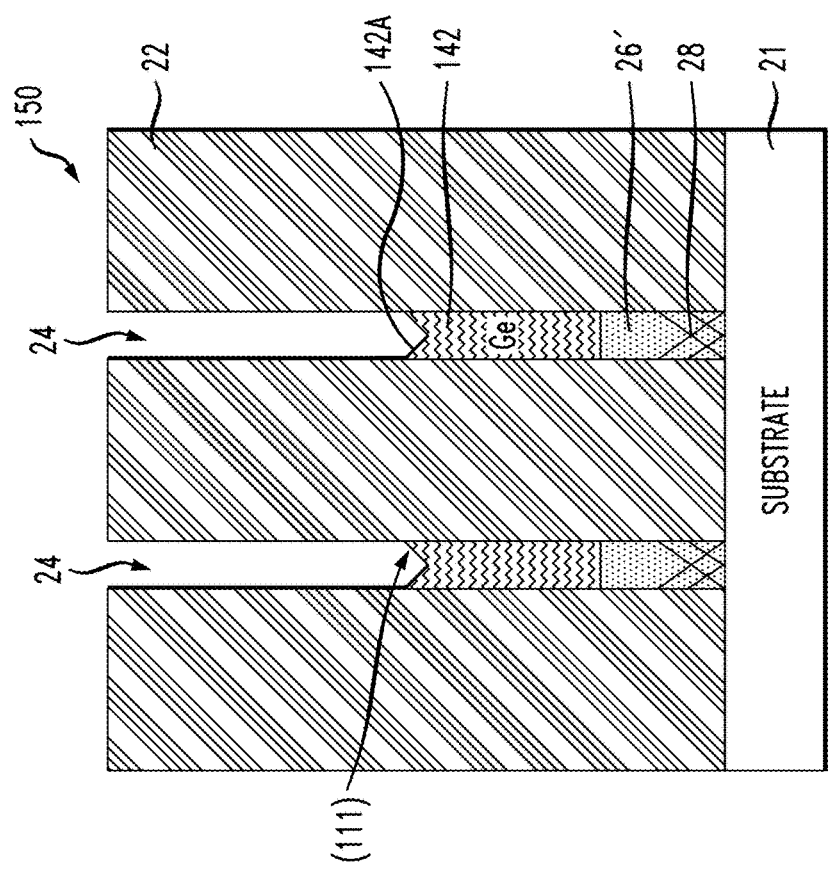
FIG. 14 is a schematic, cross-sectional view showing a monolithic structure including a patterned dielectric layer on a semiconductor substrate and semiconductor fin portions extending from the semiconductor substrate and within the patterned dielectric layer.

Referring to FIG. 14, an oxide layer 22 is deposited and patterned on a silicon substrate layer 21 to form vertical trenches 24 that extend down to the substrate layer. In one example, a silicon-on-insulator (SOI) substrate includes a substrate layer that is employed in lieu of a bulk silicon substrate.

A silicon germanium fin (for example, $Si_{0.75}Ge_{0.25}$) is then epitaxially grown on a substrate layer having a {100} top surface. Aspect ratio trapping causes defects 28 in the silicon germanium fin to be trapped near the bottom of the fin. The silicon germanium fin is then recessed to form bottom base fin regions 26' within the vertical trenches 24. The discussion above with respect to FIGS. 1A and 1B, 2A and 2B, and 3A and 3B describes techniques that may be employed for these stages.

A germanium semiconductor layer or an SiGe layer having a high germanium content is then deposited. This semiconductor layer can be pure germanium or SiGe with high percentage of germanium (e.g., Ge %>70%). As long as the deposited layer will be compressively strained, it is beneficial for pFETs. The Ge or SiGe layer is epitaxially grown on the top surface of the silicon germanium base region 26', planarized and recessed, forming the exemplary structure 140 schematically illustrated in FIG. 14. The recessed germanium or silicon germanium layer is compressively strained and comprises a fin region 142 that can later be employed in the fabrication of a p-FinFET device.

Figure 15:
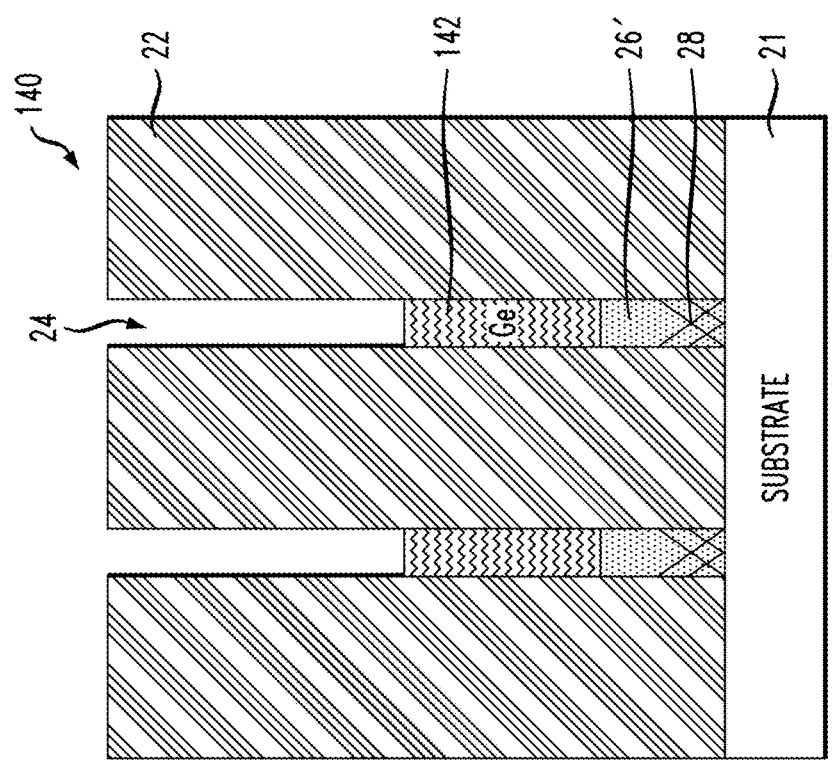
FIG. 15 is a schematic, cross-sectional view of the structure shown in FIG. 14 following a crystalline orientation-dependent etch of the semiconductor fin portions to form faceted top surfaces thereon.

The top surfaces of the germanium fin regions 142 are subjected to a crystalline orientation dependent etch to form faceted top surfaces 142A thereon. The faceted top surfaces 142A may be obtained using an aqueous solution containing ammonia. The top surfaces of the resulting fin regions 142 comprise {111} planes. FIG. 15 schematically illustrates an exemplary structure 150, as shown in cross-section, following formation of the faceted germanium top surfaces. {111} planes have the slowest etch rate compared to {110} and {100} planes. Eventually the etch will stop on {111} planes.

A buffer layer 144 is formed within the trenches 24 on the exposed {111} surfaces of the germanium fin regions 142. In an exemplary embodiment, a metal organic chemical vapor deposition (MOCVD) process is employed to grow an indium phosphide (InP) layer. Growth of the InP layer may be followed by planarization and recessing to form the buffer layer 144 and spaces within the trenches 24 above the buffer layer. In some embodiments, the InP layer can serve as an aspect ratio trapping (ART) layer to confine the defects in InP so the later formed III-V layer grown on the top surface of the InP layer can be substantially free of defects. Alternatively, the InP layer can be free of defects. Whether or not the InP buffer layer 144 contains defects depends on the epitaxy condition and thickness. As the InP layer is sacrificial and is replaced with a dielectric in later processing, the presence or absence of defects therein is not critical. A III-V layer such as gallium arsenide (GaAs) is epitaxially grown on the top surface of the buffer layer 144, also using a MOCVD process. Excess III-V material can be removed by CMP. A III-V top fin region 146 is accordingly formed in each trench 24 and extends to the top surface of the dielectric layer 22. A GaAs layer epitaxially grown on an InP layer will be under uniaxial tensile strain, thereby enhancing electron mobility, and can be employed in forming an nFET device. An exemplary structure 160 as schematically illustrated in FIG. 16 includes parallel semiconductor fin structures extending vertically from a substrate layer 21. Each fin structure includes a bottom silicon germanium base region 26', a compressively strained germanium or silicon germanium fin region 142 epitaxially formed on the base region 26', an epitaxial III-V buffer layer on a faceted, top surface 142A of the germanium fin region 142, and a compound semiconductor (e.g. III-V) fin region 146 epitaxially grown on the buffer layer.

Compound semiconductor materials that may be employed in forming fin regions 146 include III-V, II-VI compound semiconductors or other like semiconductors. III-V compound semiconductors may have a composition defined by the formula AlX1GaX2InX3AsY1PY2NY3SbY4, where X1, X2, X3, Y1, Y2, Y3, and Y4 represent relative proportions, each greater than or equal to zero and X1+X2+X3+Y1+Y2+Y3+Y4=1 (1 being the total relative mole quantity). II-VI compound semiconductors may have a composition ZnA1CdA2SeB1TeB2, where A1, A2, B1, and B2 are relative proportions each greater than or equal to zero and A1+A2+B1+B2=1 (1 being a total mole quantity).

The structure 160 is subjected to processing steps similar to those described above subsequent to obtaining the structure 70 depicted in FIGS. 5A and 5B. In other words, a hardmask is formed on the multi-layer fin structures, anchor regions are formed at opposing fin structure ends, and the buffer layer 144 between the semiconductor fin regions is replaced by a dielectric layer 148 to provide electrical isolation therebetween. The dielectric layer 22 is recessed sufficiently to expose the germanium fin regions 142 and the III-V fin regions 146 and the hardmask is removed. A monolithic structure 170 as schematically illustrated, including parallel fin structures 175 illustrated in cross-section in FIG. 17, may accordingly be obtained. Vertically stacked pFETs and nFETs are formed on the monolithic structure 170 such that portions of the germanium fin regions 142 and III-V fin regions 146 are operable as channel regions with enhanced carrier mobility.

Exemplary processing steps/stages used in the fabrication of exemplary structures including vertically stacked, electrically isolated pFETs and nFETs having oppositely strained channel regions are disclosed herein. Although the overall fabrication method and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1$^{st}$ *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

Given the discussion thus far, an exemplary method of fabricating a finned, monolithic semiconductor structure includes forming parallel trenches 24 within a dielectric layer 22 and extending down to a semiconductor substrate layer 21. A bottom semiconductor base region 26' is formed within each of the trenches and adjoins the semiconductor substrate layer 21. Defects 28 are trapped within the bottom semiconductor base region by aspect ratio trapping. A first semiconductor fin region (34 or 142) is formed within each trench 24 on the bottom semiconductor base region 26', the first semiconductor fin region having a first uniaxial strain type. A top semiconductor base region (e.g. base region 26" or buffer layer 144) is formed within each of the trenches 24. A second semiconductor fin region (36B or 148) is formed within each trench on the top semiconductor base region and has a second uniaxial strain type. The first uniaxial strain type comprises one of a tensile strain and a compressive strain and the second uniaxial strain type is different from the first strain type. The method may further include electrically isolating the first semiconductor fin region and the second semiconductor fin region by, for example, replacing a top semiconductor base region with a dielectric layer.

In accordance with a further aspect of the invention, a finned, monolithic semiconductor structure including a tensile-strained semiconductor fin portion and a compressively strained semiconductor fin portion within a fin stack is further provided. The monolithic semiconductor structure includes a substrate layer 21 and a fin structure extending vertically with respect to the substrate layer. The fin structure comprises vertically stacked layers including a bottom semiconductor fin region (34, 142) having a first uniaxial strain type, a top semiconductor fin region (36B or 146) having a second uniaxial strain type, and a dielectric layer (76 or 148) between and electrically isolating the bottom semiconductor fin region and the top semiconductor fin region. The first uniaxial strain type comprises one of a tensile strain and a compressive strain and the second uniaxial strain type is different from the first uniaxial strain type. The fin structure may further include a bottom semiconductor base region 26' including a relaxed upper portion adjoining the bottom semiconductor fin region. In some embodiments, the bottom semiconductor fin region and the bottom semiconductor base region comprise germanium, the bottom semiconductor base region having a different germanium concentration than the bottom semiconductor fin region. In some embodiments, a silicon layer 36A is located between the bottom semiconductor fin region and the dielectric layer.

Semiconductor devices including an n-type FinFET and a p-type FinFET are provided in accordance with further embodiments of the invention. A multi-layer stack having a fin-type configuration extends vertically with respect to a semiconductor substrate layer and includes an n-type FinFET including a tensile-strained channel region, a p-type FinFET including a compressive-strained channel region, and a dielectric layer between and electrically isolating the n-type FinFET from the p-type FinFET. FIGS. 12A, 12B and 12C illustrate an exemplary structure 120 wherein an n-type FinFET is stacked above a p-type FinFET, both having enhanced carrier mobility.

An exemplary multi-layer stack employed in such semiconductor devices includes a bottom semiconductor fin region having a first uniaxial strain type, the first uniaxial strain type comprising one of a tensile strain and a compressive strain. A top semiconductor fin region of the stack has a second uniaxial strain type. The dielectric layer is between the bottom semiconductor fin region and the top semiconductor fin region and provides electrical isolation of these fin regions. A bottom semiconductor base region 26' includes a relaxed upper portion adjoining the bottom semiconductor fin region. The tensile-strained channel region of the n-type FinFET includes a portion of one of the semiconductor fin regions. The compressive-strained channel region of the p-type FinFET includes a portion of the other of the bottom and top semiconductor fin regions.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from finned structures formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A finned, monolithic semiconductor structure, comprising:
    a substrate layer; and
    a fin structure extending vertically with respect to the substrate layer, the fin structure comprising vertically stacked layers including:
    a bottom semiconductor fin region having a first strain type;
    a top semiconductor fin region having a second strain type; and
    a dielectric layer between and electrically isolating the bottom semiconductor fin region with respect to the top semiconductor fin region;
    wherein the first strain type is different from the second strain type,
    wherein the fin structure further includes an epitaxial bottom semiconductor base region on the substrate layer and including a relaxed upper portion, the bottom semiconductor fin region being epitaxial with respect to the bottom semiconductor base region.

2. The finned, monolithic semiconductor structure of claim 1, wherein the bottom semiconductor fin region and the bottom semiconductor base region comprise germanium, the bottom semiconductor base region having a different germanium concentration than the bottom semiconductor fin region.

3. The finned, monolithic semiconductor structure of claim 2, further including a silicon layer between the bottom semiconductor fin region and the dielectric layer.

4. The finned, monolithic semiconductor structure of claim 1, wherein the bottom semiconductor fin region and the top semiconductor fin region include {100} or {110} sidewall planes.

5. The finned, monolithic semiconductor structure of claim 1, wherein the top semiconductor fin region comprises a compound semiconductor material.

6. The finned monolithic semiconductor structure of claim 5, wherein the bottom semiconductor fin region comprises a germanium or silicon germanium layer having a faceted top surface adjoining the dielectric layer.

7. The finned monolithic semiconductor structure of claim 1, further including:
    an oxide layer on the substrate layer, the fin structure being partially embedded within the oxide layer; and
    dielectric anchor structures adjoining first and second end portions of the fin structure and extending through the oxide layer.

8. A semiconductor device, comprising:
    a semiconductor substrate layer; and
    a multi-layer stack extending vertically with respect to the semiconductor substrate layer, the multi-layer stack including:
        an n-type FinFET including a tensile-strained channel region;
        a p-type FinFET including a compressive-strained channel region; and
        a dielectric layer vertically between and electrically isolating the n-type FinFET from the p-type FinFET,
    wherein the multi-layer stack includes:
    a bottom semiconductor fin region having a first uniaxial strain type, the first uniaxial strain type comprising one of a tensile strain and a compressive strain;
    a top semiconductor fin region having a second uniaxial strain type, the second uniaxial strain type being different from the first uniaxial strain type;
    the dielectric layer being between and electrically isolating the bottom semiconductor fin region and the top semiconductor fin region; and
    a bottom semiconductor base region on the substrate layer and including a relaxed upper portion, the bottom semiconductor fin region being epitaxial with respect to the bottom semiconductor base region;
    wherein the tensile-strained channel region of the n-type FinFET includes a portion of one of the bottom semiconductor fin region and the top semiconductor fin region, and further wherein the compressive-strained channel region of the p-type FinFET includes a portion of another of the bottom semiconductor fin region and the top semiconductor fin region.

9. The semiconductor device of claim 8, wherein the bottom semiconductor fin region and the bottom semiconductor base region comprise germanium, the bottom semiconductor base region having a different germanium concentration than the bottom semiconductor fin region.

10. The semiconductor device of claim 8, wherein a portion of the bottom semiconductor fin region comprises the channel region of the p-type FinFET and a portion of the top semiconductor fin region comprises the channel region of the n-type FinFET.

11. The semiconductor device of claim 10 wherein the bottom semiconductor fin region is a germanium or silicon germanium fin region having a faceted top surface and the top semiconductor fin region comprises a compound semiconductor material.

12. The semiconductor device of claim 10 wherein the bottom semiconductor fin region comprises silicon germanium having n-type conductivity and the top semiconductor fin region comprises silicon having p-type conductivity.

13. The semiconductor device of claim 8, wherein the tensile-strained channel region and the compressive-strained channel region comprise fin sidewall portions comprising {100} or {110} planes.

* * * * *